US012656439B2

(12) United States Patent

Khan et al.

(10) Patent No.: US 12,656,439 B2

(45) Date of Patent: Jun. 16, 2026

(54) ARTIFICIAL INTELLIGENCE DISTORTION CORRECTION FOR MAGNETIC RESONANCE ECHO PLANAR IMAGING

(71) Applicant: Siemens Healthineers AG, Forchheim (DE)

(72) Inventors: Shujaat Khan, Plainsboro, NJ (US); Mahmoud Mostapha, Princeton, NJ (US); Mariappan S. Nadar, Plainsboro, NJ (US); Thorsten Feiweier, Poxdorf (DE); Bryan Clifford, Belmont, MA (US); Mengwei Ren, Jersey City, NJ (US)

(73) Assignee: Siemens Healthineers AG, Forchheim (DE)

( * ) Notice: Subject to any disclaimer, the term of this patent is extended or adjusted under 35 U.S.C. 154(b) by 246 days.

(21) Appl. No.: 18/507,516

(22) Filed: Nov. 13, 2023

(65) Prior Publication Data

US 2025/0155536 A1 May 15, 2025

(51) Int. Cl.
*G01R 33/565* (2006.01)
*G01R 33/56* (2006.01)
*G06T 12/20* (2026.01)

(52) U.S. Cl.
CPC ... *G01R 33/56554* (2013.01); *G01R 33/5608* (2013.01); *G06T 12/20* (2026.01); *G06T 2210/41* (2013.01); *G06T 2211/441* (2023.08)

(58) Field of Classification Search
CPC .......... G01R 33/5608; G01R 33/56554; G06T 11/006; G06T 2210/41; G06T 2211/441
See application file for complete search history.

(56) References Cited

U.S. PATENT DOCUMENTS

| | | | | |
|---|---|---|---|---|
| 8,160,319 B2 * | 4/2012 | Holland | ........... | G01R 33/56563 |
| | | | | 382/128 |
| 11,004,183 B2 | 5/2021 | Zahneisen et al. | | |
| 2020/0020082 A1 | 1/2020 | Zahneisen et al. | | |
| 2021/0364589 A1 * | 11/2021 | Bilgic | .................. | A61B 5/7207 |

FOREIGN PATENT DOCUMENTS

WO    WO-2023049210 A2 *   3/2023   ............... G06T 7/33

OTHER PUBLICATIONS

Andersson, Jesper LR, Stefan Skare, and John Ashburner. "How to correct susceptibility distortions in spin-echo echo-planar images: application to diffusion tensor imaging." Neuroimage 20.2 (2003): 870-888.

(Continued)

*Primary Examiner* — Gregory H Curran

(57) ABSTRACT

For distortion correction in magnetic resonance (MR) echo planar imaging (EPI), a combination of supervised and unsupervised training provides deep learning with generalized applicability across different use cases as well as sufficient training data (e.g., less ground truth data is needed due to the inclusion of unsupervised learning). The neural network for displacement estimation may include deformable convolution and/or layers for a non-diffeomorphic displacement field. The network architecture features and/or combined supervised and unsupervised learning may be used together or individually.

19 Claims, 5 Drawing Sheets

(56)                    References Cited

OTHER PUBLICATIONS

Balakrishnan, Guha, et al. "VoxelMorph: a learning framework for deformable medical image registration." IEEE transactions on medical imaging 38.8 (2019): 1788-1800.

Clifford, et al. "Ultrafast Brain Imaging with Deep-Learning Multi-Shot EPI: Technical Implementation," Magnetom Flash (80) Jan. 2022.

Dai, Jifeng, Haozhi Qi, Yuwen Xiong, Yi Li, Guodong Zhang, Han Hu, and Yichen Wei. "Deformable convolutional networks." In Proceedings of the IEEE international conference on computer vision, pp. 764-773. 2017.

Duong, S. T. M., et al. "Susceptibility artifact correction for sub-millimeter fMRI using inverse phase encoding registration and T1 weighted regularization." Journal of Neuroscience Methods 336 (2020): 108625.

Duong, Soan TM, et al. "An unsupervised deep learning technique for susceptibility artifact correction in reversed phase-encoding EPI images." Magnetic Resonance Imaging 71 (2020): 1-10.

Legouhy, Antoine, et al. "Correction of susceptibility distortion in EPI: a semi-supervised approach with deep learning." International Workshop on Computational Diffusion MRI. Cham: Springer Nature Switzerland, 2022.

Ruthotto, L., et al. "Diffeomorphic susceptibility artifact correction of diffusion-weighted magnetic resonance images." Physics in Medicine & Biology 57.18 (2012): 5715.

Zahneisen, Benjamin, et al. "Deep flow-net for EPI distortion estimation." Neuroimage 217 (2020): 116886.

Zhu, Xizhou, Han Hu, Stephen Lin, and Jifeng Dai. "Deformable convnets v2: More deformable, better results." In Proceedings of the IEEE/CVF conference on computer vision and pattern recognition, pp. 9308-9316. 2019.

* cited by examiner

100 — Acquire MR EPI Training Data

110 — Reconstruct EPI Images

120 — Estimate and Correct with SFC

130 — Machine Train NN to Estimate MR Distortion Fields

132 — Input EPI Images to NN

140 — Produce MR Distortion-Corrected Image(s)

150 — Store NN

700 — Scan Patient with Medical Imaging System

710 — Reconstruct and/or Distortion Correct

720 — Display Medical Image

802

800 — Main Field Magnet

810 — Gradient Coils

820 — RF Coil

830

820 — Whole Body Coil

810 — Gradient Coils

800 — Main Field Magnet

840 — Image Processor

850 — Memory

NN — 852

860 — Display

ARTIFICIAL INTELLIGENCE DISTORTION CORRECTION FOR MAGNETIC RESONANCE ECHO PLANAR IMAGING

FIELD

This disclosure relates to magnetic resonance (MR) echo planar imaging (EPI).

BACKGROUND

EPI allows fast magnetic resonance scans. Due to off-resonant spins, EPI is prone to geometric distortions along the phase encoding directions. Geometric distortions result in spatially varying displacements (shifts) of voxel information in images. These distortions can significantly impair radiologic evaluation and can result in extra costs (e.g., impaired diagnoses or repeat exams). Additionally, distorted images can lead to down-stream analysis pipeline errors, such as incorrect registration of functional or diffusion-weighted imaging data to undistorted imaging data.

The distorted images may be corrected. Some approaches estimate the displacement field and use the displacement field to correct the distorted image as a post-processing step. However, displacement field estimation is an ill-posed problem, and typical iterative solver-based methods (e.g., TOPUP) are computationally expensive and require more time than is practical in most clinical environments.

In one approach, a static field correction (SFC) is performed. A low resolution $B_0$-map, which is proportional to the displacement field, is acquired by an additional scan (or scans) and used to correct the distorted image via an unwarping algorithm. SFC has two main drawbacks: (i) SFC requires additional time to acquire separate scan(s) used for displacement field estimation, and (ii), because the displacement field is estimated from a separate (typically lower resolution) scan, the estimated displacement field may not be fully consistent with the imaging data and thereby lead to imperfect correction/unwarping.

In another approach, two or more images are acquired with opposing phase encoding directions, referred to as Blip Up and Blip Down (BUDA) acquisitions. The displacement field that minimizes the difference between the two images is found using an iterative optimization technique. This approach has the advantage of estimating a field that is fully consistent with the measured imaging data. However, the computational cost is prohibitively high, making it infeasible in a clinical setting.

Recently, deep learning (DL) approaches accelerate the distortion correction process. However, these techniques are highly optimized for specific use cases (e.g., optimized for a particular acquisition protocol, contrast, sampling-rate, and anatomy). This limits the clinical utility of such approaches, since most clinical environments cover a broad range of use cases and operating conditions. It is also difficult, costly, and sometimes impossible to acquire a large dataset of raw data with good quality targets for the deep training.

SUMMARY

By way of introduction, the preferred embodiments described below include methods, systems, instructions, and computer readable media for distortion correction in MR EPI. A combination of supervised and unsupervised training provides deep learning models with generalized applicability across different use cases as well as sufficient training data (e.g., less ground truth data is needed due to the inclusion of unsupervised learning). The neural network for displacement estimation may include deformable convolution and/or layers for a non-diffeomorphic displacement field. The network architecture features and/or combined supervised and unsupervised learning may be used together or individually.

In a first aspect, a method of machine training is provided for MR distortion correction in EPI. First MR training data, including ground truth images, is acquired. A neural network is machine trained to estimate MR distortion fields using the first MR training data in supervised training and differences of first images from second images in unsupervised training. The first images have opposing phase encoding directions than the second images. The neural network as machine trained is stored.

In a second aspect, a system is provided for distortion correction in MR EPI. A medical scanner is configured to scan a patient. An image processor is configured to reconstruct a representation of the patient from the scan, configured to estimate a displacement field with a machine-trained neural network, the neural network comprising at least one deformable convolution layer, and configured to correct the representation with the displacement field. A display is configured to display an image of the patient generated from the representation as corrected.

In a third aspect, a system is provided for distortion correction in magnetic resonance echo planar imaging. A medical scanner is configured to scan a patient. An image processor is configured to reconstruct a representation of the patient from the scan, configured to estimate a diffeomorphic displacement field with a machine-trained neural network, the neural network comprising at least one velocity estimation layer, and configured to correct the representation with the displacement field. A display is configured to display an image of the patient generated from the representation as corrected.

The present invention is defined by the following claims, and nothing in this section should be taken as a limitation on those claims. The illustrative examples below summarize further aspects. Further aspects and advantages of the invention are discussed below in conjunction with the preferred embodiments and may be later claimed independently or in combination.

DETAILED DESCRIPTION

The neural network for distortion estimation is trained using comparison of images, distortion field, and/or both to ground truth. To reduce the number of quality ground truth examples needed, the neural network is also trained (sequentially or jointly) using unsupervised training. Differences between image pairs reconstructed from scans with opposing phase encoding directions are minimized for the unsupervised training. By using both supervised and unsupervised training, a deep learning approach may be trained with a lesser requirement on the size and/or quality of the training data. Supervise and/or unsupervised training may be used.

The neural network for distortion estimation may include adaptive mask and adaptive offset-based deformable convolutional blocks. These adaptive or deformable convolution blocks provide effective and robust modeling of spatial transformations, which enables high-performance across a broad range of applications and operating conditions (e.g., contrast, anatomy, sampling rates, noise-levels, etc.). The proposed approaches are generalizable, making the approaches suitable for different configurations. The approaches are suitable for different types of inputs and outputs, such as image-to-image, image-to-field map, k-space to field-map or k-space-to-image.

Distortion correction is accurately provided under different sampling rates (e.g., R=1 and R=4 where R is the undersampling factor) and/or using different initial reconstruction methods. The initial reconstructions may vary in: (a) the level of under sampling, (b) consistency with the measured data, and (c) signal-to-noise ratio (SNR). However, the level of correction provided is similar for each case, which indicates that the proposed approaches are robust to varying input conditions and out-of-distribution data. Unlike conventional iterative solver-based approaches, the proposed neural network for distortion estimation is computationally fast and may be used to design a runtime distortion-corrected MR reconstruction framework with high noise tolerance, low estimation error, fast reconstruction using a graphics processing unit, and/or improved g-factor in integrated reconstruction.

Figure 1:
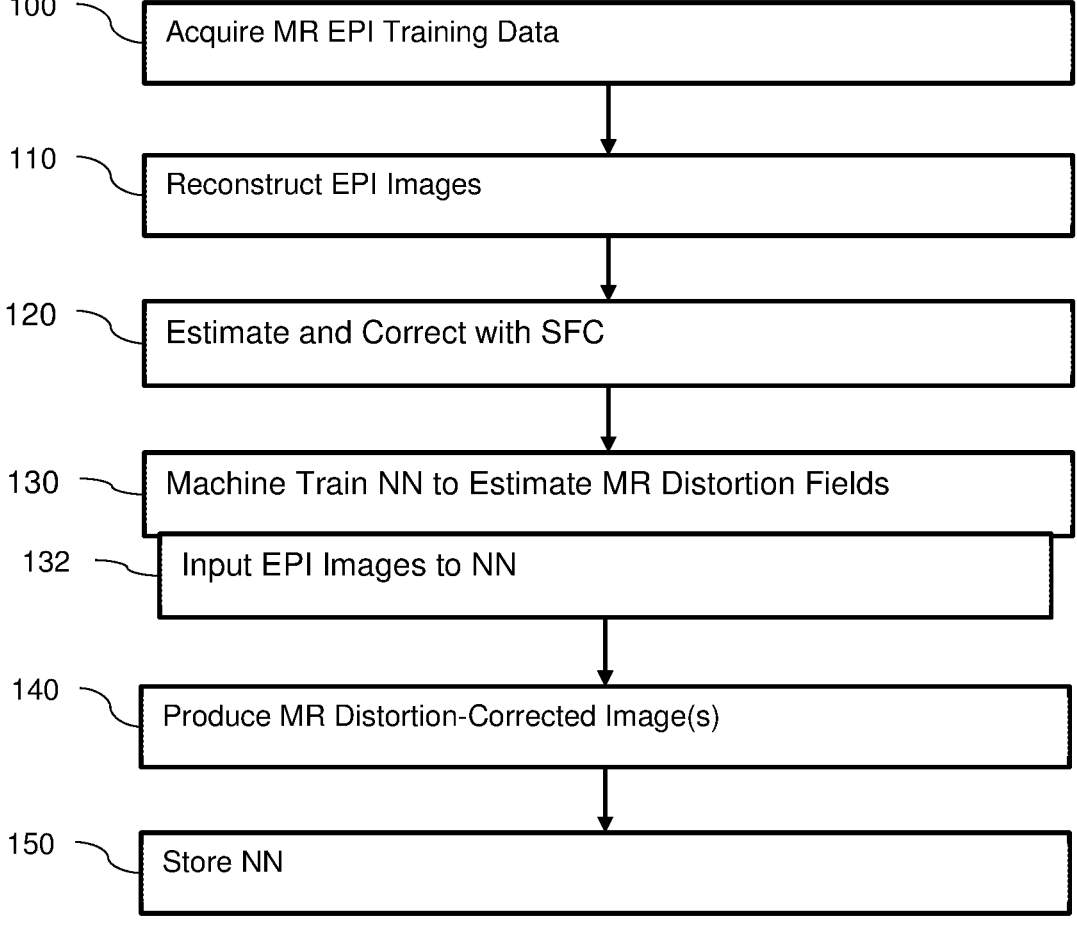
FIG. 1 is a flow chart diagram of one example of a method for machine training for distortion estimation and/or correction.

FIG. 1 is a flow chart diagram of one embodiment of a method for machine training for MR distortion correction in EPI. A combination of supervised (with ground truth) and unsupervised (e.g., comparison of images) training is used. The machine-learned model (e.g., neural network) being trained may include adaptive or deformable convolution and/or implement non-diffeomorphic displacement fields. Once trained, the machine-learned model may be used with the same learned values in distortion correction for EPI for patients. The architecture and previously performed training result in better distortion correction, such as rapid correction over a broad range of EPI imaging conditions.

The method is implemented by a computer, such as a personal computer, workstation, and/or server. Other computers may be configured to perform the acts of FIG. 1. The MR scanner or a control processor may implement the method. In one embodiment, the computer and a database are used to acquire training data from a database, reconstruct, estimate, machine train, and apply distortion correction. The trained machine-learned model is then stored in a memory. The stored model is distributed to one or more MR scanners and/or servers for application using the model as fixed (i.e., the learned values of the variables are not changed for reconstructions for a given patient and/or for different patients).

The method is performed in the order shown (i.e., top to bottom or numerical). Other orders may be used, such as performing the application of act 140 as part of the machine training in act 130. Similarly, the reconstruction of act 110 may be performed as part of the machine training of act 130, such as reconstructing on demand as each sample set of the training data is used.

Figure 7:
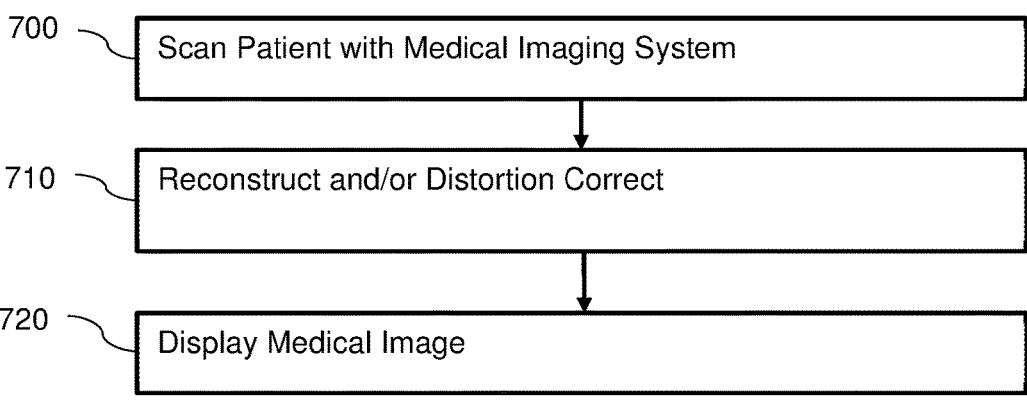
FIG. 7 is a flow chart diagram of one example of a method for applying a machine-learned network for distortion estimation and/or correction.

Additional, different, or fewer acts may be provided. For example, instead of or in addition to storing in act 150, the machine-learned model is applied to previously unseen scan data for a patient in a reconstruction as shown in FIG. 7. As another example, an act for gathering or creating training data is performed. In yet another example, act 120 is not performed. In another example, acts 110, 130, and/or 140 are combined. As another example, act 140 may be part of act 130 (producing as part of the training).

In act 100, training data is acquired. The training data is acquired from memory, scanning, or transfer. To machine train, training data is created, gathered, or accessed.

The training data includes many sets of data, such as MR k-space data and/or reconstructed images in sets. Tens, hundreds, or thousands of sample scan data are acquired, such as from scans of patients, scans of phantoms, simulation of scanning, and/or by image processing to create further samples. In one approach, simulated displacement field-maps are generated based on known scan data to be used as ground truth. Other model-based or iterative estimation of displacement field (e.g., TOPUP) may be used to generate the displacement field. PyTorch or other simulation may generate warped labels using ground truth. The input samples may be generated by simulation, such as modeling the MR system and patient. Combinations of actual scanning (patients and/or phantoms) and simulated scans may be used.

Many examples that may result from different scan settings, patient anatomy, scanner characteristics, or other variance that results in different samples in scanning are used. An already gathered or created MR dataset may be used for the training data. In one approach, the samples represent many variations. For example, the samples include different contrasts, such as many samples of each of T1, T2, T2*, T2-FLAIR, and/or diffusion weighted imaging (DWI). As another example, many samples of each of different orientations are acquired. In yet another example, many samples for each of different body regions (e.g., brain, liver, prostate, breast, and/or extremities) are acquired. Combinations of contrast, orientation, and/or body region variations may be provided throughout the training data. Combinations of variation through scanning (e.g., different body regions) and type of scanning (actual and simulation) may be used.

The samples are from scanning or simulation following one or more protocols, such as EPI. The training data may use k-space data or image domain data for the samples as input. For ground truth, the samples include displacement fields and/or images matched with the inputs. The samples are used in deep learning to determine the values of the learnable variables (e.g., values for convolution kernels) that produce outputs with minimized cost across the variance of the different samples.

For unsupervised machine learning, the training data does not include ground truth information. For example, desired images and displacements from the input samples (e.g., k-space data) are not provided for training. Instead, the loss is provided by comparison of images with opposite phase encoding or displacement fields. The comparison provides an objective measure for performance as the more similar images or fields indicates better distortion correction.

For supervised training, the training data includes ground truth information. 1, 5, 10, 25, 50, 75 or other percentage of the samples of the training data include ground truth images (EPI images or displacement image). The desired representation (reconstruction), displacement field, and/or image resulting from a given sample is provided. The displacement field, reconstructed representation (e.g., three-dimensional distribution of voxels), and/or output (e.g., rendered or extracted) image are different types of images that may be used for ground truth.

Figure 2:
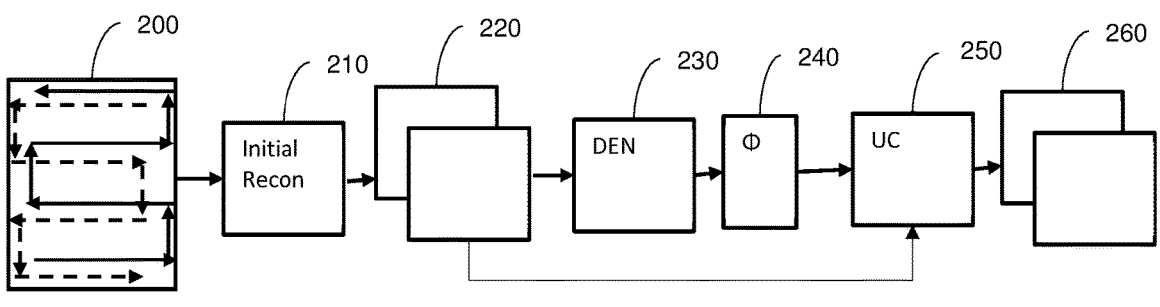
FIG. 2 illustrates one approach for distortion estimation and correction.

In one approach, the acquired training data includes k-space data for a blip-up and blip-down (BUDA) MR echo planar acquisitions as the input sample. The BUDA MR echo planar acquisitions are multi-shot EPI acquisitions and have opposing phase encoding directions. For a given sample, there are two sets of k-space data, each acquired in a same scan or different scans but with opposing phase encoding directions. FIG. 2 shows a representation of this where k-space data 200 includes k-space data from opposite phase encoding directions as represented by the solid and dashed arrows. Other multi-shot EPI acquisitions may be used. In other approaches, single shot-EPI acquisitions (e.g., two single shot-EPI) with inverted phase encoding provides the k-space data with opposing phase encoding directions.

A processor may generate augmented data. The acquired data is used to create additional samples of input and/or output (ground truth). The data may be generated by loading from memory and/or by creating the data from other training data. In other embodiments, the augmentation data was previously created and stored or provided with or as part of the training data.

To generate the augmentation data, the samples are augmented to create variance. Any physics of the input data or samples may be varied. For example, noise is added to the input samples (e.g., noise in k-space or image space). Both noise-free (or lesser noise) and noisy (more noise) samples are provided. The added noise may be from system, scan, and/or patient modeling, may be experimentally determined noise, and/or may be randomly or pseudo-randomly generated. As another example, rotation (orientation) is applied. The training data is augmented with rotated samples. In another example, the acceleration factor is changed to create new samples. The k-space data of the training data may be down sampled to generate samples with a greater acceleration factor (e.g., R=1 vs R=4). The sampling pattern may be varied. For example, undersampling factor (R) augmentation and/or center lines augmentation is used. The sampling may be varied, such as using every other, every third, or every N lines where N is a non-zero positive integer. Partial Fourier (e.g., sampling less than all available frequencies on one side of the spectrum) sampling and/or sampling with reduced resolution (e.g., less than all available frequencies on both sides of the spectrum) may be used. As another example, the sign of displacement fields may be altered. The opposite (positive or negative) or flipped sign for interchanged input is used to create other displacement fields. Since two images are generated from the opposing phase encoding directions, the alignments between the image pairs as inputs or outputs (ground truth) may be altered to generate additional samples. Other examples include 180-degree rotated input and their corresponding ground truths, input data processed with different pre-registration schemes (e.g., applying a spatial registration which treats first images as fixed and the second images as moving, or vice versa, or treating both images as moving). Other augmentation may alter image quality, such as using different initial reconstructions of act 110, the different noise levels, and/or the different acceleration factors. Combinations of these augmentations may be used.

The augmentation creates different samples from the same data. For example, two thousand samples are provided as initial training data. These samples are from different scans. The same augmentation is generated for each sample, resulting in four thousand samples or two thousand pairs of samples. Different types of augmentation may be applied to different samples or the same samples. For example, multiple augmentations (e.g., noise and acceleration factor) are applied to a given sample, resulting in a pair of the original sample and the augmentated sample that includes a different sampling pattern and added noise. Any combination of one or more types of augmentation for a given augmented sample and creation of different numbers of pairs with different augmentation may be used.

In act 110, an image processor reconstructs pairs of images from the k-space data of the training samples. For example, blip-up and blip-down images are reconstructed from each k-space data sample set.

FIG. 2 shows a model for machine training using the training data as k-space data 200. In this approach, k-space data 200 is processed by an initial image reconstruction (IR) 210, which may include denoising and taking care of other artifacts. The IR 210 may be a deep learning network (e.g., a hybrid network based on unrolled iterative reconstruction frameworks) and/or an optimization (e.g., SENSE or GRAPPA) based technique. The IR 210 produces two opposite phase encoding (PE) images 220 by processing the k-space data acquired with two single shot EPI (ss-EPI), other EPI acquisitions with inverted phase-encoding acquisitions or BUDA multi-shot EPI (ms-EPI) acquisitions with shot-specific phase-encoding polarities.

In act 120 of FIG. 1, the image processor estimates B0 distortion with static field correction (SFC) or other image model-based approach for estimation and correction and corrects the blip-up images and the blip-down images 220 with the SFC prior to inputting to the neural network for training based on that sample. The distortion correction is augmented by this initial estimation of the displacement field using separately acquired B0-map SFC. Rather than relying on the machine-learned model alone for estimation of the displacement, SFC is used for an initial estimate followed by a deep convolutional neural network or other neural network (machine learning model) for refinement of the displacement. This use of an initial displacement estimation using SFC may allow the neural network to be smaller, requiring less processing and/or memory. The neural network is to be trained to estimate the residual displacement field where the separate scan for SFC is used for a base displacement field. Other displacement estimation than SFC may be used. The correction is performed on the images 220 (see FIG. 2) prior to input to the neural network in training of act 130. Where distortion correction is performed as part of reconstruction, the ground truth may be generated with an encoding model-based approach instead of SFC. Meta-learning or semi-supervised learning may be used (e.g., pretraining where a network is trained on one dataset and used to teach a new network).

In act 132, the images 220, with or without initial displacement estimation (e.g., SFC), are input to the neural network for training of act 130. Other inputs may be provided. For example, the images 220 and an initial displacement field are separately input to the neural network.

In one approach represented in FIG. 2, the blip-up images and blip-down images 220 of the various samples are input to the neural network. The neural network, through optimization, is to be trained to output MR distortion fields based on these inputs. The images 220 will be fed to the distortion estimation network (DEN) 230 to estimate a displacement field (or equivalently a $B_0$-map) $\phi$ 240 that can be used for distortion correction by unwarping and intensity correction 250.

In act 130, a computer (e.g., image processor) or another machine trains a model for estimating distortion fields, such as training a neural network for estimating a displacement field for each input sample. The neural network is machine trained for distortion estimation using the training data and/or augmentation data, including many input samples of sets of EPI images with or without corresponding ground truth outputs. Other inputs may be used instead of the images, such as the k-space data where the neural network is also trained to reconstruct.

In one embodiment, deep learning is used to train the model. The training learns both the features of the input data and the conversion of those features to the desired output (i.e., displacement field and/or displacement corrected images). Backpropagation, RMSprop, ADAM, or another optimization is used in learning the values of the learnable parameters of the network (e.g., the convolutional neural network (CNN) or fully connection network (FCN)). For unsupervised learning, the differences (e.g., L1, L2, mean square error, or other loss) between the estimated outputs for both inputs of each sample pair are minimized (i.e., minimize difference between distortion corrected EPI images with opposite phase encoding directions). For supervised learning, the difference from the output (e.g., displacement field or distortion corrected EPI images) to the ground truth is minimized.

In one example, the supervised training uses loss for the displacement field, such as a sum of mean-squared-error (MSE), mean-absolute-error (MAE) between the ground truth and the estimated displacement field. L1, L2, or other loss may be used. In another example, the supervised training uses loss for the unwarped and intensity corrected images (i.e., after distortion correction based on the estimated displacement field) from the ground truth EPI images. The loss may be L1, L2, MSE, MAE, or another loss between ($I_{out,up}$, $I_{target,up}$) and ($I_{out,down}$, $I_{target,down}$) where "target" is the ground truth and "out" refers to the corrected images.

For unsupervised training, the loss is based on the differences between the EPI images after distortion correction using the estimated displacement fields. Difference may be subtraction, similarity of features of the images, or other similarity. The differences between the pairs of distortion corrected EPI images (images having opposing phase encoding directions) is minimized. For example, the loss is similarity between output image pairs ($I_{out,up}$, $I_{out,down}$). Example losses may be L1, L2, MSE, MAE, multiscale-normalized-cross-correlation (msNCC), mutual-information (MI), or another loss. In an alternative, the unsupervised loss is calculated from the estimated displacement fields. For each displacement field, the loss is a measure of variance or smoothness or a fit error with respect to a physical model (e.g., superposition of spherical harmonics). Smoother maps may be desired.

Where unsupervised and supervised machine training are used together, a joint loss may be used. For samples in the training data with ground truth, both the ground truth and unsupervised losses may be combined as a joint loss. For example, the joint loss is a sum or weighted sum of a supervised loss (e.g., a difference of the estimated MR distortion fields from the ground truth) and an unsupervised loss (e.g., the difference of the EPI images with the opposing phase encoding directions after distortion correction). Unsupervised loss is used alone for samples without ground truth.

The unsupervised and supervised loss may be combined in the machine training of act 120 in other ways. For example, sequential training is applied. Supervised machine training with a loss based on a difference of the output from the ground truth is performed after training the model with the unsupervised training using samples without using ground truth. If a small supervised dataset (e.g., 5-30% of the samples) corresponding to the final distortion correction application is available, the model is fined tuned on that dataset with ground truth after the unsupervised learning training. Other sequences may be used, such as training using ground truth initially, then unsupervised training, and then fine tuning with ground truth examples. Supervised and unsupervised training may be cycled until convergence in performance.

Any architecture or layer structure for machine learning to perform an operation for distortion correction may be used. The architecture defines the structure, learnable parameters, and relationships between parameters. In one embodiment, a convolutional, transformer-based, or another neural network is used. Any number of layers and nodes within layers may be used. A DenseNet, U-Net, encoder-decoder, Deep Iterative Down-Up convolutional neural network (CNN), image-to-image, and/or another network may be used. Some of the network may include dense blocks (i.e., multiple layers in sequence outputting to the next layer as well as the final layer in the dense block). Down sampling and/or up sampling layers may be included. Skip connections may be used. Any known or later developed neural network may be used. Any number of hidden layers and/or nodes may be provided between the input layer and output layer.

Figure 3:
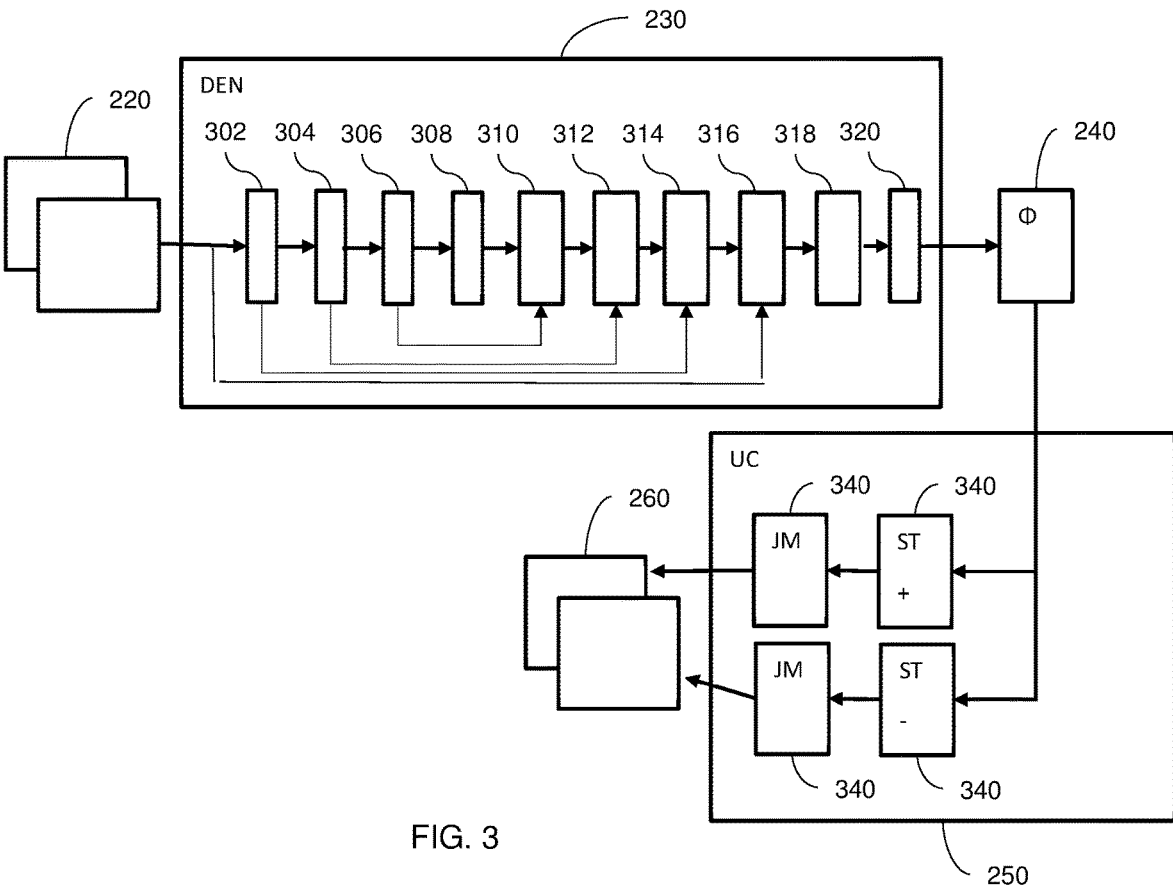
FIGS. 3 and 4 illustrate different example neural network architectures for EPI distortion estimation and correction.
Figure 4:
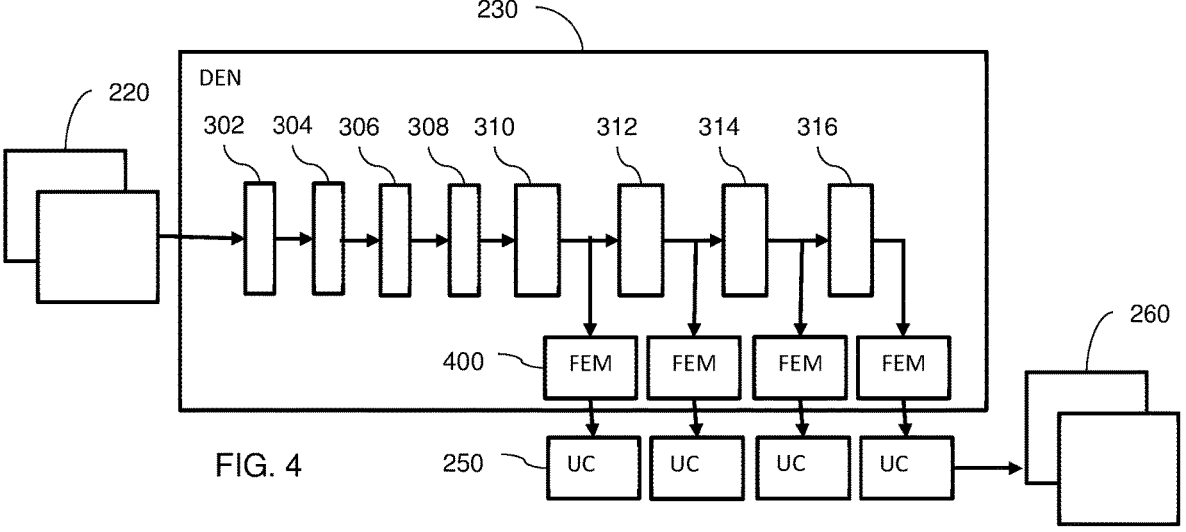

Different deep learning-based distortion estimation networks 230 may be used, depending on the desired performance and computational tradeoffs. FIG. 3 may represent two different neural networks, where layers 318 are different. FIG. 4 shows another example neural network.

FIG. 3 shows an example of the neural network or distortion estimation network 230 as well as the unwarping and intensity correction 250. The neural network 230 is a cascade of different convolutional, pooling and up-sampling layers. The neural network 230 includes adaptive mask and adaptive offset-based deformable convolutional (DC) blocks and filtration. This example neural network 230 includes both deformable and non-deformable convolution layers. The deformable convolution layers have an adaptive mask and/or offset for the convolution kernel, so have adaptive mask parameters that may be learned other than the kernel values alone. The layer 302 is a 3×3 Deformable Convolution two dimensional (2D)+LeakyReLU layer with a stride of 2 with 32 output channels. Layers 304 and 306 are each a 3×3 Deformable Convolution 2D+LeakyReLU layers with a stride of 2 with 64 output channels. Layer 308 is 3×3 Deformable Convolution 2D+LeakyReLU layer with a stride of 2 with 128 output channels. The input of each layer is a stack of 2D images where the number of images corresponds to the number of input channels. Layers 310, 312, and 314 are each a combination of a 3×3 Deformable Convolution 2D+LeakyReLU layer with a stride of 1, a 2× up-sampling nearest layer, and a concatenation layer at 128 output channels. Layer 316 is a combination of a 3×3 Deformable Convolution 2D+LeakyReLU layer with a stride of 1, a 2× up-sampling nearest layer, and a concatenation layer at 64 output channels. Layer 318 is a combination of three layers of 3×3 Convolutional 2D+LeakyReLU with a stride of 1 at 64, 32, 32 output channels across the combination. These convolutional layers of layer 318 are standard or non-deformable. The kernel values may be learned but the mask is fixed. Layer 320 is a 3×3 Convolution layer 2D that outputs the displacement field 240. Skip connections are shown from layer 302 to 316, 304 to 314, 306 to 310. No, different, or additional skip connections to the concatenation layers may be used. Convolutional and/or deformable layers may be included in dense blocks with additional skip connections. This architecture produces high-quality displacement field maps for most cases.

Additional, different, or fewer layers may be used. Other types of layers may be used as well or instead of layers described above.

The architecture of FIG. 3 may be altered, providing a different approach. The layer 318 is changed to be deformable convolution, such as a combination of three layers of 3×3 deformable convolution 2D+LeakyReLU at a stride of 1 at 64, 32, 32 resolutions across the combination. The standard convolution blocks of layer 318 are replaced with deformable convolution block so that the only standard convolution remaining is the output layer 320. All convolutions prior to the output are deformable. A fully deformable network 230 may be used. Other combinations of deformable and non-deformable (standard) convolution may be used.

In another approach, the output layer 320 is altered. The output layer 320 is changed to provide diffeomorphic layers for a diffeomorphic displacement field. For example, one layer with learnable parameters estimates the velocity. Another layer with fixed (non-learnable), learnable, or a combination thereof is provided for integration of the velocities into displacements. The integrated velocities are the predicted MR distortion or displacement field (diffeomorphic). In MR, the field is not necessarily diffeomorphic, so no integration is needed. Therefore, in other approaches, the displacement field is estimated directly without integration layers, and the at least one velocity estimation layer outputs the displacement field (non-diffeomorphic).

FIG. 4 shows another approach for the network 230. Skip connections are not shown but may be provided. A multi-resolution loss is used for this architecture. The different layers 310, 312, 314, and 316 output at different resolutions. Each of these outputs is provided to a respective field estimation layer 400. The field estimation layer 400 is formed from layers 318 and 320. Each field estimation layer 400 outputs to an unwarping and intensity correction block 250. This architecture has learning parameters for deformable and non-deformable convolutions layers with multi-resolution loss terms. Fine detail improvement may be provided using the multi-resolution warping.

FIG. 4 shows incorporation of an intelligent, multi-resolution training loss. Field estimation modules 400 are replaced with field estimation layers. These field estimation modules 400 are only used during training and take the respective outputs of layers 310, 312, 314, 316, which have differently sized (smaller to larger) outputs. The layers (or modules 400) contain convolutional or other neural network layers learn to combine the channels in the outputs of 310, 312, 314, and 316 to produce a field map (Phi). Each field map would be at a different size (smaller size corresponding to larger voxels, i.e., lower resolution). These maps are interpolated to the target image/field map resolution and passed as input to the UC models 250 to correct the input images. Then, the final training loss would contain a combination of the losses corresponding to the losses of images produced by each UC layer 250.

In the overall model of FIG. 2, the image processor applies the estimated MR distortion fields 240 to the EPI images (e.g., blip-up and/or blip down images) 220. The application results in the distortion corrected EPI images 260. In this model, the initial reconstruction 210 is followed by deep learning-based distortion correction 250. To generate distortion corrected images 260, the k-space data 200 is processed with the initial reconstruction 210. Then, the output 220 is fed to the distortion estimation network 230 to estimate the displacement field 240. Using the estimated displacement-field (ϕ) 240 with unwarping and intensity correction 250, the images 220 are corrected to produce distortion correction images 260. A combined distortion corrected image may be provided instead of the two images 260.

Distortion correction 250 and the images 260 perform the unwrapping correction via image domain as opposed to an encoding model-based method. The images 250 may be used in training even where the output of the model is only the field estimation.

As shown in FIG. 3, the unwarping and intensity correction 250 includes separate paths (+,−) for the images of the EPI pair. Each path includes a spatial transformation 340 as the unwarping followed by a Jacobian modulation 340 for intensity correction. Other unwarping and/or intensity correction approaches may be used. The unwarping and intensity correction 250 is fixed or not part of the network being trained. In another approach, the intensity correction 340 (e.g., Jacobian modulation) is formed from a machine learning model, such as a convolutional neural network. Post processing for residual intensity correction is machine trained. A loss is provided for the Jacobian determinants. This intensity correction model may be separately machine trained (e.g., sequential training with the network 230) or jointly trained (e.g., end-to-end).

Figure 5:
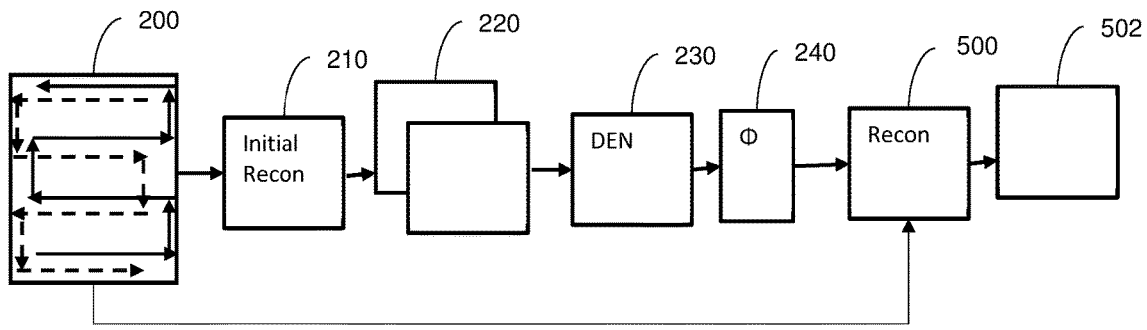
FIG. 5 illustrates another approach for distortion estimation and correction.

FIG. 5 shows an alternative model to use for the machine training. FIG. 5 may represent deployment, training, or both.

An integrated image reconstruction is used. Rather than apply the estimated displacement field 240 directly to the images 220, the displacement field 240 is used as an input for another reconstruction 500 from the k-space data 200. For example, the blip-up and blip-down images are again reconstructed in 500 from the k-space data 200 but with the estimated distortion fields 240. For each sample, a blip-up image and a blip-down image is reconstructed from the corresponding k-space data and estimated MR distortion field.

The reconstruction 500 may use optimization, such as SENSE, GRAPPA, or iterative reconstruction algorithms that consider the distortion fields 240. In another approach, the reconstruction 500 uses a machine learning model. The k-space data 200 and the estimated MR distortion fields 240 are input to the machine learning model, and the machine learning model outputs an image 502 or the second blip-up images and the second blip-down images 260. The reconstruction 500 uses Phi as an input to a data acquisition model and passes data 200 and the data acquisition model as inputs to an optimization or neural network, which generates an undistorted or corrected image. In place of a standard unwarping and intensity correction 250, a network (or other model-based reconstruction method) incorporates the estimated displacement map 240 into an image reconstruction algorithm to generate high-quality, aliasing artifact free images from noisy and/or under sampled k-space data. The displacement field is used as a B0 field in reconstruction to directly process the k-space data to generate distortion free images 502.

The machine learning model for reconstruction 500 and the neural network 230 for displacement estimation are trained separately or together. For example, the neural network 230 and the machine learning model of the reconstruction 500 are machine trained in a fine tuning with joint optimization. Both networks or models may be initially trained separately and then fine-tuned via joint training. The fine tuning is of the combined network or joint optimization for both networks.

Figure 6:
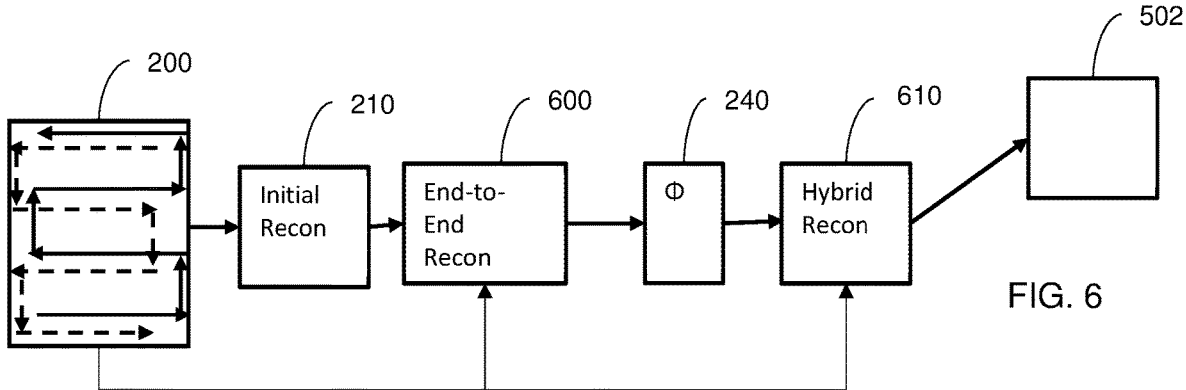
FIG. 6 illustrates yet another approach for distortion estimation and correction.

FIG. 6 illustrates another approach for the overall model used for machine training and then application. An end-to-end learning scheme is used. A combined or end-to-end network 600 for performing both displacement field estimation and distortion-corrected image reconstruction is provided. The end-to-end network 600 may be an unrolled neural network for reconstruction. The neural network includes both the displacement estimation (network 230) and reconstruction (machine learning model) 500 in one architecture. In this approach, a joint optimization problem can be solved using a distortion correction network (network 230) generated ground truth from the approach of FIG. 5. This end-to-end architecture may be able to provide improved performance due to its integration of all the components of the reconstruction and distortion correction problem.

In the example of FIG. 6, an initial reconstruction 210 is provided, such as SENSE reconstruction. This results in initial EPI images $\rho_0$. End-to-end network 600 acts the same as reconstruction 500 of FIG. 5 when reconstruction 500 is a network based approach. This unrolled neural network alternates between model-based data-consistency improving steps and neural network-based artifact removal steps. End-to-end network 600 may be a single block that estimates the undistorted image directly or several network-reconstruction and distortion estimation networks applied in an alternating fashion to iteratively refine the images and displacement fields. As such, one input to the end-to-end network 600 may be the data 200.

The hybrid reconstruction 610 takes the estimated field map 240 as an output of the end-to-end network 600 as well as the measured data 200 and outputs the corrected image 502. The hybrid reconstruction 610 uses a network generated image and field map as inputs to a regularized optimization problem, which produces the final output image 502. An important feature of such blocks is the ability for uses to specify the weight (importance) attributed to the network-generated image.

Using the approaches of FIGS. 2, 5, 6, or another approach, the machine learning of act 130 trains the machine learning models and/or networks. Based on the optimization using the loss or losses, the values for the learnable parameters are machine learned from the training data. Machine learning is an offline training phase where the goal is to identify an optimal set of values of learnable parameters of the model that can be applied to many different inputs. These machine-learned parameters can subsequently be used during clinical operation to correct for distortion in EPI in act 140. In act 140, the displacement field and EPI images or EPI data are used to produce distortion corrected EPI images or a distortion corrected image. The correction may be through an act operating on an output or may be performed as part of reconstruction (e.g., including the displacement field into an acquisition encoding model). The machine-learned model may be stored in act 150 prior to application in act 140. Act 140 may occur, as well and/or instead, as part of training in act 130. Once learned, the machine-learned model is used in an online processing phase (application or testing) in which scan data from a scan of a patient is reconstructed into an image and the distortions in the image are reduced, removed, or not in a generated image. For example, once trained, the neural network 230 is applied to estimate a displacement field, which is used for either distortion correction or for reconstruction to reconstruct with less distortion. In the FIG. 6 approach, the network as trained is used to reconstruct EPI images with little or no distortion. The resulting EPI images are for that patient.

In act 150 of FIG. 1, the trained neural network 230 and/or any other machine learning models as trained are stored. The computer or image processor stores the machine-learned models resulting from the machine learning. For example, the machine-learned neural network 230 is stored. The machine-learned model is saved in memory. After training, the machine-learned model or models are represented as a matrix, filter kernels, and/or architecture with the learned values. The learned convolution kernels, weights, connections, and/or layers of the neural network or networks are provided and stored. The machine-learned model may be stored locally or transferred over a network or by moving the memory to other computers, workstations, and/or MR scanners.

The model resulting from the machine training using the plurality of the samples is stored. This stored model has fixed weights or values of learnable parameters determined based on the machine training. These weights or values are not altered by patient-to-patient or over multiple uses for different medical scans. The weights or values are fixed, at least over a number of uses and/or patients. The same weights or values are used for different scans corresponding to different patients and/or different examinations or appointments. The same values or weights may be used by different medical scanners. The values or weights may be fine-tuned for specific scanners but otherwise fixed for use by that scanner. The fixed machine-learned model or models are to be applied without needing to train as part of the application. Re-training or updated training may be provided.

FIG. 7 is a flow chart diagram of one embodiment of a method for distortion correction for MR EPI. A neural network as trained is applied for at least estimation of the displacement field or distortion correction. The neural network or other machine learning model may be used for reconstruction and/or to apply the correction. Once trained, the network is used to correct distortions for EPI for a patient. The application is part of scanning and reconstruction for patient diagnosis of a given patient for a given examination, scan, and/or appointment. The network was previously trained as noted for FIG. 1.

During application to one or more different patients and corresponding different scan data, the same learned weights or values are used. The model and values for the learnable parameters are not changed from one patient to the next, at least over a given time (e.g., weeks, months, or years) or given number of uses (e.g., tens or hundreds). These fixed values and corresponding fixed model are applied sequentially and/or by different processors to scan data for different patients. The model may be updated, such as retrained, or replaced but does not learn new values as part of application for a given patient.

Figure 8:
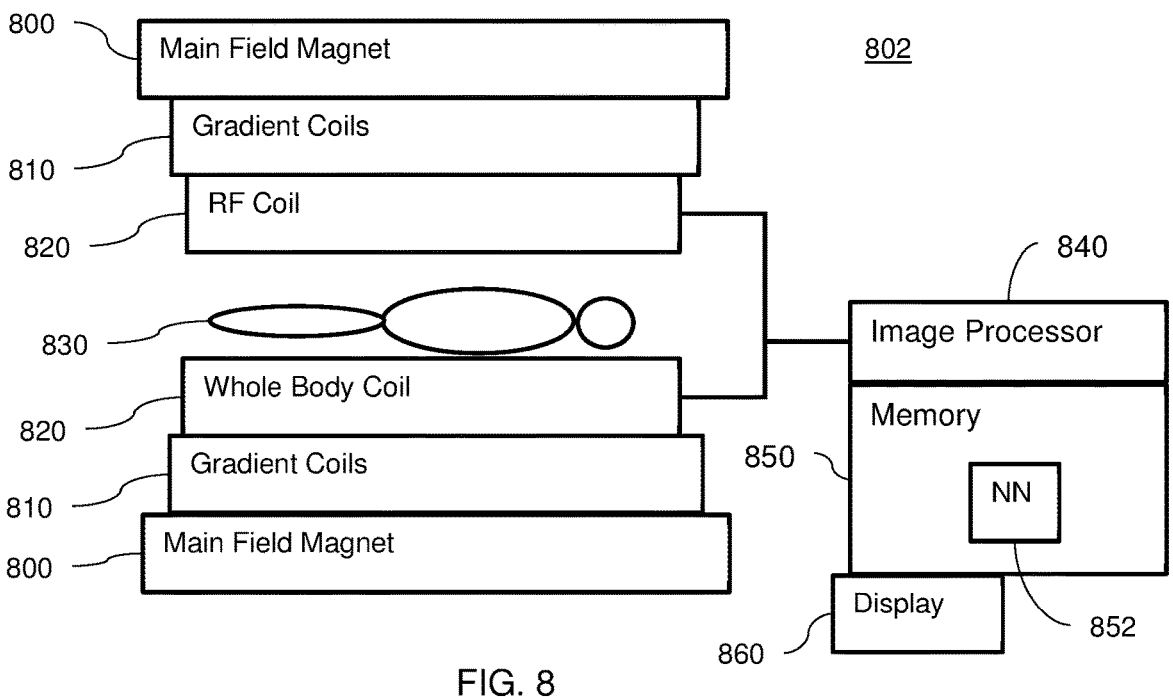
FIG. 8 is a block diagram of an example of an MR system for medical imaging with a machine-trained model.

The method is performed by the system of FIG. 8 or another system. The medical scanner scans the patient. An image processor reconstructs with less distortion and/or applies distortion correction using the network as trained. A display displays the medical images resulting from the scanning. Other components may be used, such as a remote server or a workstation performing the reconstruction, distortion field estimation, and/or display.

The method is performed in the order shown or other orders. Additional, different, or fewer acts may be provided. For example, a preset, default, or user input settings are used to configure the scanning prior art act 700. As another example, the image is stored in a memory (e.g., computerized patient medical record) or transmitted over a computer network instead of or in addition to the display of act 720.

In act 700, the medical imaging system scans a patient. The scan is guided by a protocol, such as an EPI acquisition. The scanning results in measurements. In an MR example, a pulse sequence is created based on the configuration of the MR scanner (e.g., the imaging protocol selected). The pulse sequence is transmitted from coils into the patient. The resulting responses are measured by receiving radio frequency signals at the same or different coils. The scanning results in k-space measurements as the scan data. K-space data may be acquired using opposing phase encoding.

In act 710, an image processor reconstructs a representation of the patient from the scan data. The image processor reconstructs a medical image in the form of a display image (i.e., formatted for display), a volume image (i.e., voxels), or an area or plane image (i.e., planar representation). For MR reconstruction, the k-space data is transformed into an image representation, such as scalar values representing different spatial locations with or without phase information. Pixel or voxel values are reconstructed as the MR image. The spatial distribution of measurements in object or image space is formed. This spatial distribution is an image representing the patient.

The reconstruction may use estimated displacements to reduce or remove distortion. For example, the model of FIG. 2 or 5 is implemented. A trained network estimates the displacements, and the image processor then corrects the images or reconstructs again using the displacements. Alternatively, a trained network generates the EPI with less distortion by having been trained to limit distortion. For example, the model of FIG. 6 is implemented. The distortion correction is performed, at least in part, using a machine-learned model, such as a neural network trained with deep machine learning. The machine-learned model is previously trained, and then applied as trained for EPI with less or no distortion.

Other processing may be performed on the input k-space measurements before input. Other processing may be performed on the output representation or reconstruction, such as spatial filtering, color mapping, and/or display formatting. In one embodiment, volume rendering is performed to generate a display image.

In act 720, a display (e.g., display screen or device) displays the medical images, such as the MR EPI images. The medical images, after or as part of any post processing, is formatted for display on the display. The display presents the image for viewing by the user, radiologist, physician, clinician, and/or patient. The image assists in diagnosis.

The displayed image may represent a planar region or area in the patient. Alternatively, or additionally, the displayed image is a volume or surface rendering from voxels (three-dimensional distribution) to the two-dimensional display.

The same deep machine-learned model (e.g., network 230) may be used for different patients. The same or different copies of the same machine-learned model are applied for different patients, resulting in reconstruction of patient-specific representations or reconstructions using the same values or weights of the learned parameters of the model. Different patients and/or the same patient at a different time may be scanned while the same or fixed trained machine-learned model is used for distortion correction. Other copies of the same deep machine-learned model may be used for other patients with the same or different scan settings and corresponding sampling or under sampling in k-space.

FIG. 8 shows one embodiment of a system for distortion correction in MR EPI. The system scans a given patient and applies a neural network 852 in distortion correction, such as estimating displacement for unwarping and intensity correction, estimating displacement for use in reconstruction, or reconstructing with less distortion. The neural network 852 was trained using either supervised or unsupervised machine training or both with or without an architecture that included deformable or adaptive convolution and/or non-diffeomorphic displacements. Other machine learning models may be stored in the memory 850 for application by the image processor 840 for EPI.

The system is implemented by an MR scanner 802 or system, a computer based on data obtained by MR scanning, a server, or another processor. The MR scanning system is only exemplary, and a variety of MR scanning systems can be used to collect the MR data. In the embodiment of FIG. 8, the system is or includes the MR scanner or MR system. The MR scanner 802 is configured to scan a patient. The scan provides scan data in a scan domain. The system scans a patient to provide k-space measurements (measurements in the frequency domain). In a given scan or examination (e.g., imaging appointment), the patient may be scanned multiple times as part of an EPI protocol. In alternative scans, the patient is scanned once to acquire all the k-space data.

In the MR medical scanner 802, magnetic coils 800 create a static base magnetic field (B0) in the body of patient 830. Gradient coils 810, in response to gradient signals supplied thereto by a gradient and shim coil control module, produce position dependent and shimmed magnetic field gradients in three orthogonal directions and generate magnetic field pulse sequences.

RF coil 820 (whole body and/or local coils), which in response to RF pulse signals, produces magnetic field pulses that rotate the spins of the protons in the imaged body of the patient 830. Gradient and shim coil control module in conjunction with RF module, as directed by central controller, control slice-selection, phase-encoding, readout gradient magnetic fields, radio frequency transmission, and magnetic resonance signal detection, to acquire magnetic resonance signals representing planar slices or volumes of patient 830. In EPI acquisition, k-space data is acquired using opposing phase encoded directions.

The methods outlined before are applicable to data acquired with non-EPI techniques. For instance, in the presence of B0 variations, data acquired with gradient-echo (GRE), spin-echo (SE) or turbo-spin-echo (TSE) imaging may exhibit distortions along the frequency-encoding axis due to spins with off-resonance frequency. As compared to EPI, the amount of distortion in non-EPI acquisitions is usually small. However, for clinical applications that require high spatial fidelity (e.g., radiotherapy or surgical planning), the correction of non-EPI data may show benefit. Rather than using data with inverted phase-encoding (i.e., blip-up and blip-down) as the input, non-EPI acquisitions use data with inverted frequency-encoding (i.e., inverting the polarity of the gradient which is present when data gets sampled).

In response to applied RF pulse signals, the RF coil 820 receives MR signals. The MR signals are detected and processed to provide an MR dataset to an image processor 840 for processing into an image (i.e., for reconstruction in the object domain from the k-space data in the scan domain).

In some embodiments, the image data processor is in or is the central controller, control processor, or control system.

The image processor 840 is an image processor that reconstructs a representation of the patient from the k-space data and/or performs distortion correction. The image processor is a general processor, digital signal processor, three-dimensional data processor, graphics processing unit, application specific integrated circuit, field programmable gate array, artificial intelligence processor, tensor processor, digital circuit, analog circuit, combinations thereof, or another now known or later developed device for distortion correction. The image processor is a single device, a plurality of devices, or a network. For more than one device, parallel or sequential division of processing may be used. Different devices making up the image processor may perform different functions, such as reconstructing by one device and distortion correction by another device. In one embodiment, the image processor is a control processor or other processor of the MR scanner. Other image processors of the MR scanner or external to the MR scanner may be used.

The image processor is configured by software, firmware, and/or hardware to correct for distortion. The image processor operates pursuant to instructions stored on a non-transitory medium (e.g., memory 850) to perform various acts described herein.

The image processor 840 is configured to implement the model of FIG. 2, 5, 6, or another model. The image processor 840 is configured to reconstruct a representation in an object domain. The image processor 840 is configured to correct the representation with the displacement field. To correct, the image processor 840 is configured to estimate displacements to then correct the reconstructed images, to estimate the displacements to then use for reconstruction again using the displacements, or to reconstruct based on machine training to reconstruct with less or no distortion. The neural network 852, such as trained as discussed above for FIG. 1, is applied as discussed above for FIG. 7 by the image processor 840.

The neural network 852 may be one of the networks of FIG. 3 or 4, or another architecture. In one approach, the neural network 852 has at least one deformable convolution layer. In another approach, the neural network 852 implements a non-diffeomorphic displacement correction. The image processor 840 is configured to estimate a non-diffeomorphic displacement field with the machine-trained neural network 852. The neural network 852 may include at least one velocity estimation layer and an integration layer to determine displacements from integrated velocities.

The distortion corrected EPI images are displayed. A generated display image of the reconstructed representation or image for a given patient is presented on the display 860. The display 860 is a CRT, LCD, plasma, projector, printer, or other display device. The display 860 is configured by loading an image to a display plane or buffer. The display 860 is configured to display the distortion corrected MR EPI images of the patient. An image of the patient generated from the representation as corrected for distortion is displayed to assist in diagnosis.

Below are various illustrative examples. Different combinations of approaches or aspects may be used. An example feature herein used in training may provide for a trained neural network with a resulting same feature used in application, so the example teachings for the training are applicable to the resulting trained neural network for application. Example method acts may be provided in systems and vice versa.

Illustrative example 1: A method of machine training for magnetic resonance (MR) distortion correction in echo planar imaging, the method comprising: acquiring first MR training data including ground truth images; machine training a neural network to estimate MR distortion fields using the first MR training data in supervised training and differences of first images from second images in unsupervised training, the first images having opposing phase encoding directions than the second images; and storing the neural network as machine trained.

Illustrative example 2: The method of example 1 wherein machine training comprises machine training with a joint loss for (a) a difference of the estimated MR distortion fields from the ground truth images and for (b) the difference of the first and second images with the opposing phase encoding directions.

Illustrative example 3: The method of examples 1 or 2 wherein the first MR training data comprises k-space data for a blip-up and blip-down MR echo planar acquisitions, the blip-up and blip-down MR echo planar acquisitions having the opposing phase encoding directions; further comprising: reconstructing first blip-up images and first blip-down images; inputting the first blip-up images and first blip-down images to the neural network; and applying estimated MR distortion fields to the first blip-up images and/or the first blip-down images, the application resulting in the first and second images.

Illustrative example 4: The method of example 3 further comprising estimating B0 distortion with static field correction and correcting the first blip-up images and the first blip-down images with the static field correction prior to inputting to the neural network.

Illustrative example 5: The method of any of examples 3 or 4 wherein applying the estimated MR distortion fields comprises applying an unwarping followed by Jacobian modulation for intensity correction.

Illustrative example 6: The method of any of examples 3-5 wherein applying the estimated MR distortion field comprises intensity correction by a machine learning model.

Illustrative example 7: The method of any of examples 1-6 wherein machine training comprises learning parameters of adaptive mask and adaptive offset-based deformable convolution blocks without non-deformable convolution blocks.

Illustrative example 8: The method of any of examples 1-7 wherein machine training comprises learning parameters of non-diffeomorphic layers for velocity prediction and/or integration of the velocity prediction as the estimated MR distortion field.

Illustrative example 9: The method of any of examples 1-8 wherein machine training comprises learning parameters for deformable and non-deformable convolutions layers with multi-resolution loss terms.

Illustrative example 10: The method of any of examples 1-2 wherein the first MR training data comprises k-space data for a blip-up and blip-down MR echo planar acquisitions, the blip-up and blip-down MR echo planar acquisitions having the opposing phase encoding directions; further comprising: first reconstructing first blip-up images and first blip-down images from the k-space data; inputting the first blip-up images and first blip-down images to the neural network, the neural network outputting the MR distortion fields; and second reconstructing second blip-up images and second blip-down images from the k-space data and the estimated MR distortion fields; wherein machine training comprises machine training where the first images and second images are the second blip-up images and the second blip-down images, respectively.

Illustrative example 11: The method of example 10 wherein second reconstructing comprises second reconstructing with a machine learning model, the k-space data and the estimated MR distortion fields input to the machine learning model, the machine learning model outputting the second blip-up images and the second blip-down images.

Illustrative example 12: The method of example 11 wherein machine training comprises training the neural network and parameters of the machine learning model in a fine tuning with joint optimization.

Illustrative example 13: The method of any of examples 11 or 12 wherein machine training comprises end-to-end learning of the neural network, the neural network including the machine learning model.

Illustrative example 14: The method of any of examples 1-13 wherein acquiring comprises augmenting through change in orientation, acceleration factor, noise level, sign of displacement fields, and/or alignment.

Illustrative example 15: The method of any of examples 1-14 wherein acquiring comprises acquiring the first MR training data for different body regions and/or through simulation.

Illustrative example 16: A system for distortion correction in magnetic resonance echo planar imaging, the system comprising: a medical scanner configured to scan a patient; an image processor configured to reconstruct a representation of the patient from the scan, configured to estimate a displacement field with a machine-trained neural network, the neural network comprising at least one deformable convolution layer, and configured to correct the representation with the displacement field; and a display configured to display an image of the patient generated from the representation as corrected.

Illustrative example 17: The system of example 16 wherein the image processor is configured to correct by the reconstruction with the displacement field as an input to the reconstruction.

Illustrative example 18: A system for distortion correction in magnetic resonance echo planar imaging, the system comprising: a medical scanner configured to scan a patient; an image processor configured to reconstruct a representation of the patient from the scan, configured to estimate a diffeomorphic displacement field with a machine-trained neural network, the neural network comprising at least one velocity estimation layer, and configured to correct the representation with the displacement field; and a display configured to display an image of the patient generated from the representation as corrected.

Illustrative example 19: The system of example 18 wherein the image processor is configured to correct by the reconstruction with the displacement field as an input to the reconstruction.

Although the subject matter has been described in terms of exemplary embodiments, it is not limited thereto. Rather, the appended claims should be construed broadly, to include other variants and embodiments, which can be made by those skilled in the art.

What is claimed is:

1. A method of machine training for magnetic resonance (MR) distortion correction in echo planar imaging, the method comprising:
    acquiring first MR training data including ground truth;
    machine training a neural network to estimate MR distortion fields using the first MR training data in supervised training and differences of first images from second images in unsupervised training, the supervised training and unsupervised training combined with a joint loss, the first images having opposing phase encoding directions than the second images; and
    storing the neural network as machine trained.

2. The method of claim 1 wherein machine training comprises machine training with the joint loss for (a) a difference of the estimated MR distortion fields from the ground truth and for (b) the difference of the first and second images with the opposing phase encoding directions.

3. The method of claim 1 wherein the first MR training data comprises k-space data for a blip-up and blip-down MR echo planar acquisitions, the blip-up and blip-down MR echo planar acquisitions having the opposing phase encoding directions;
    further comprising:
    reconstructing first blip-up images and first blip-down images;
    inputting the first blip-up images and first blip-down images to the neural network; and
    applying estimated MR distortion fields to the first blip-up images and/or the first blip-down images, the application resulting in the first and second images.

4. The method of claim 3 further comprising estimating BO distortion with static field correction and correcting the first blip-up images and the first blip-down images with the static field correction prior to inputting to the neural network.

5. The method of claim 3 wherein applying the estimated MR distortion fields comprises applying an unwarping followed by Jacobian modulation for intensity correction.

6. The method of claim 3 wherein applying the estimated MR distortion field comprises intensity correction by a machine learning model.

7. The method of claim 1 wherein machine training comprises learning parameters of adaptive mask and adaptive offset-based deformable convolution blocks without non-deformable convolution blocks prior to an output layer.

8. The method of claim 1 wherein machine training comprises learning parameters of non-diffeomorphic layers for velocity prediction and/or integration of the velocity prediction as the estimated MR distortion field.

9. The method of claim 1 wherein machine training comprises learning parameters for deformable and non-deformable convolutions layers with multi-resolution loss terms.

10. The method of claim 1 wherein the first MR training data comprises k-space data for blip-up and blip-down MR echo planar acquisitions, the blip-up and blip-down MR echo planar acquisitions having the opposing phase encoding directions;
    further comprising:
    first reconstructing first blip-up images and first blip-down images from the k-space data;
    inputting the first blip-up images and first blip-down images to the neural network, the neural network outputting the MR distortion fields; and
    second reconstructing second blip-up images and second blip-down images from the k-space data and the estimated MR distortion fields;
    wherein machine training comprises machine training where the first images and second images are the second blip-up images and the second blip-down images, respectively.

11. The method of claim 10 wherein second reconstructing comprises second reconstructing with a machine learning model, the k-space data and the estimated MR distortion fields input to the machine learning model, the machine learning model outputting the second blip-up images and the second blip-down images.

12. The method of claim 11 wherein machine training comprises training the neural network and parameters of the machine learning model in a fine tuning with joint optimization.

13. The method of claim 11 wherein machine training comprises end-to-end learning of the neural network, the neural network including the machine learning model.

14. The method of claim 1 wherein acquiring comprises augmenting through change in orientation, acceleration factor, noise level, sign of displacement fields, and/or alignment.

15. The method of claim 1 wherein acquiring comprises acquiring the first MR training data for different body regions and/or through simulation.

16. A system for distortion correction in magnetic resonance echo planar imaging, the system comprising:
a medical scanner configured to scan a patient;
an image processor configured to reconstruct a representation of the patient from the scan, configured to estimate a displacement field with a machine-trained neural network, the neural network comprising at least one deformable convolution layer, and configured to correct the representation with the displacement field; and
a display configured to display an image of the patient generated from the representation as corrected.

17. The system of claim 16 wherein the image processor is configured to correct by the reconstruction with the displacement field as an input to the reconstruction.

18. A system for distortion correction in magnetic resonance echo planar imaging, the system comprising:
a medical scanner configured to scan a patient;
an image processor configured to reconstruct a representation of the patient from the scan, configured to estimate a diffeomorphic displacement field with a machine-trained neural network, the neural network comprising at least one velocity estimation layer, and configured to correct the representation with the displacement field; and
a display configured to display an image of the patient generated from the representation as corrected.

19. The system of claim 18 wherein the image processor is configured to correct by the reconstruction with the displacement field as an input to the reconstruction.

\* \* \* \* \*